United States Patent [19]
Hsieh

[11] Patent Number: 5,377,745
[45] Date of Patent: Jan. 3, 1995

[54] COOLING DEVICE FOR CENTRAL PROCESSING UNIT

[76] Inventor: Hsin M. Hsieh, No. 6, E. Sec., Chiao Nan Li, Industrial 6th Rd., Pingtung City, Pingtung Hsien, Taiwan, Prov. of China

[21] Appl. No.: 159,662

[22] Filed: Nov. 30, 1993

[51] Int. Cl.⁶ ............................................ H01L 23/467
[52] U.S. Cl. ............................ 165/80.3; 165/121; 165/185; 361/697; 361/709; 361/695
[58] Field of Search ................. 165/80.2, 80.3, 121, 165/122, 185; 361/695, 696, 697, 703, 709, 694

[56] References Cited

U.S. PATENT DOCUMENTS 5,288,203  2/1994  Thomas ............................ 361/394
5,299,632  4/1994  Lee .................................. 165/121

Primary Examiner—Albert W. Davis, Jr.
Attorney, Agent, or Firm—Trask, Britt & Rossa

[57] ABSTRACT

A cooling device includes a fin unit with an upper side to which a fan unit is mounted and an underside to which a central processing unit is mounted. The fin unit includes a base plate and a plurality of fins projecting upwardly from an upper side of the base plate and extending parallel to a perimeter of the base plate thereby forming a frame-like structure with a second perimeter and defining a space therein. Four ledges are defined between the perimeter of the base plate and the perimeter of the fins. At least one hook member is formed on each of two opposed ledges and a slot is formed in the ledge adjacent to each hook member. A plurality of second fins project upwardly from the upper side of the base plate in the space defined by the first-mentioned fins, each second fin having a height less than that of the first fin for mounting the fan unit in the space above the second fins. A fastener member has a first end for engaging with the hook member and a second hook end passing through the slot to securely retain the central processing unit to an underside of the base plate. The second perimeter defined by the first fins has four corners, a seat with a hole being provided in each corner for mounting the fan unit.

5 Claims, 2 Drawing Sheets

COOLING DEVICE FOR CENTRAL PROCESSING UNIT

BACKGROUND OF THE INVENTION

1. Field of the Invention

The present invention relates to a cooling device for a central processing unit (CPU) or the like.

2. Description of Related Art

Fan devices have been proposed to assist in the dissipation of heat generated by the CPUs. It is, however, found that conventional fan devices cannot effectively expel the hot air inside the computer casing and it is difficult to securely mount the fan devices to CPUs which might affect the cooling effect. Therefore, there has been a long and unfulfilled need for an improved cooling device for CPUs.

SUMMARY OF THE INVENTION

A cooling device provided by the present invention includes a fin means, a fan means mounted in the fin means, and a fastening means for securely mounting a central processing unit to the fin means.

The fin means includes a base plate and a plurality of fins projecting upwardly from an upper side of the base plate and extending parallel to a perimeter of the base plate thereby forming a frame-like structure with a second perimeter and defining a space therein. Four ledges are defined between the perimeter of the base plate and the perimeter of the fins. At least one hook member projects upwardly from each of two opposed ledges and a slot is formed in the ledge adjacent to the hook member.

A plurality of second fins project upwardly from the upper side of the base plate in the space defined by the first-mentioned fins, each second fin having a height less than that of the first fin for mounting the fan means in the space above the second fins.

A fastener member has a first end for engaging with an associated hook member and a second hook end passing through the slot to securely retain the central processing unit to an underside of the base plate. Preferably, the hook member has a flexible distal hook end and the first end of the fastener member is substantially a U-shaped member for snappingly engaging with the flexible distal hook end of the hook member.

The frame-like structure defined by the first fins has four corners, a seat with a hole being provided in each corner for mounting the fan means. The fan means includes a fan and a mount plate to which the fan is mounted. The mounting plate has four limbs extending radially and outwardly therefrom, each limb having a second hole therein which aligns with the first-mentioned hole in an associated seat, such that the mounting plate together with the fan can be securely mounted inside the first fins by screws or bolts.

Other objects, advantages, and novel features of the invention will become more apparent from the following detailed description when taken in conjunction with the accompanying drawings.

DESCRIPTION OF THE PREFERRED EMBODIMENT

Figure 1:
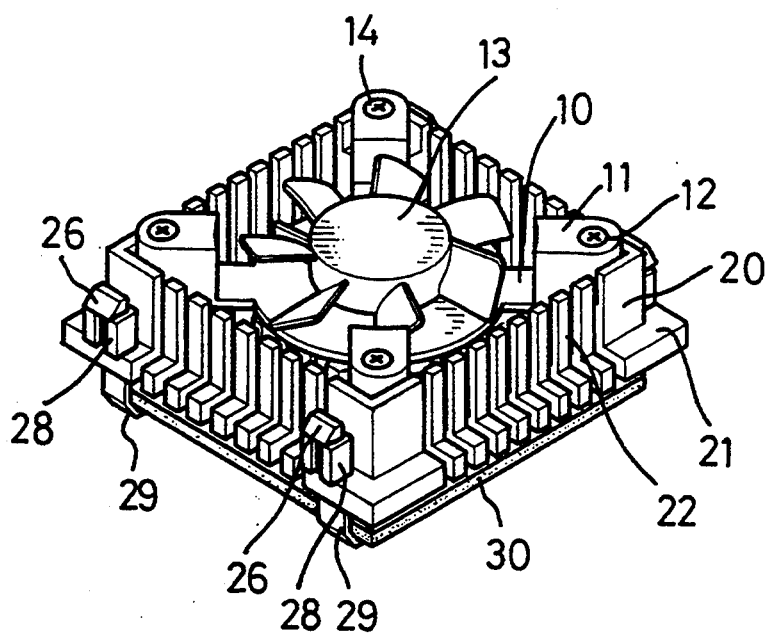
FIG. 1 is a perspective view of a central processing unit and a cooling device therefor in accordance with the present invention.
Figure 3:
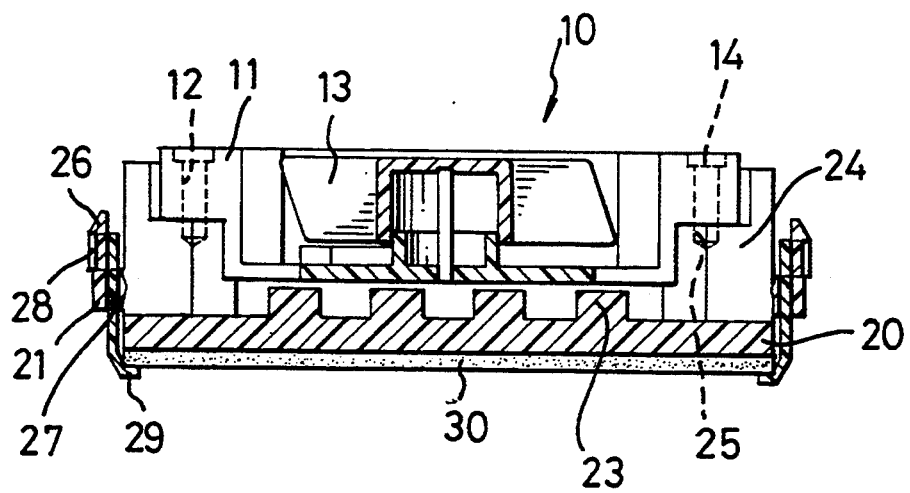
FIG. 3 is a cross-sectional side view of the central processing unit and a cooling device in an assembled manner.
Figure 2:
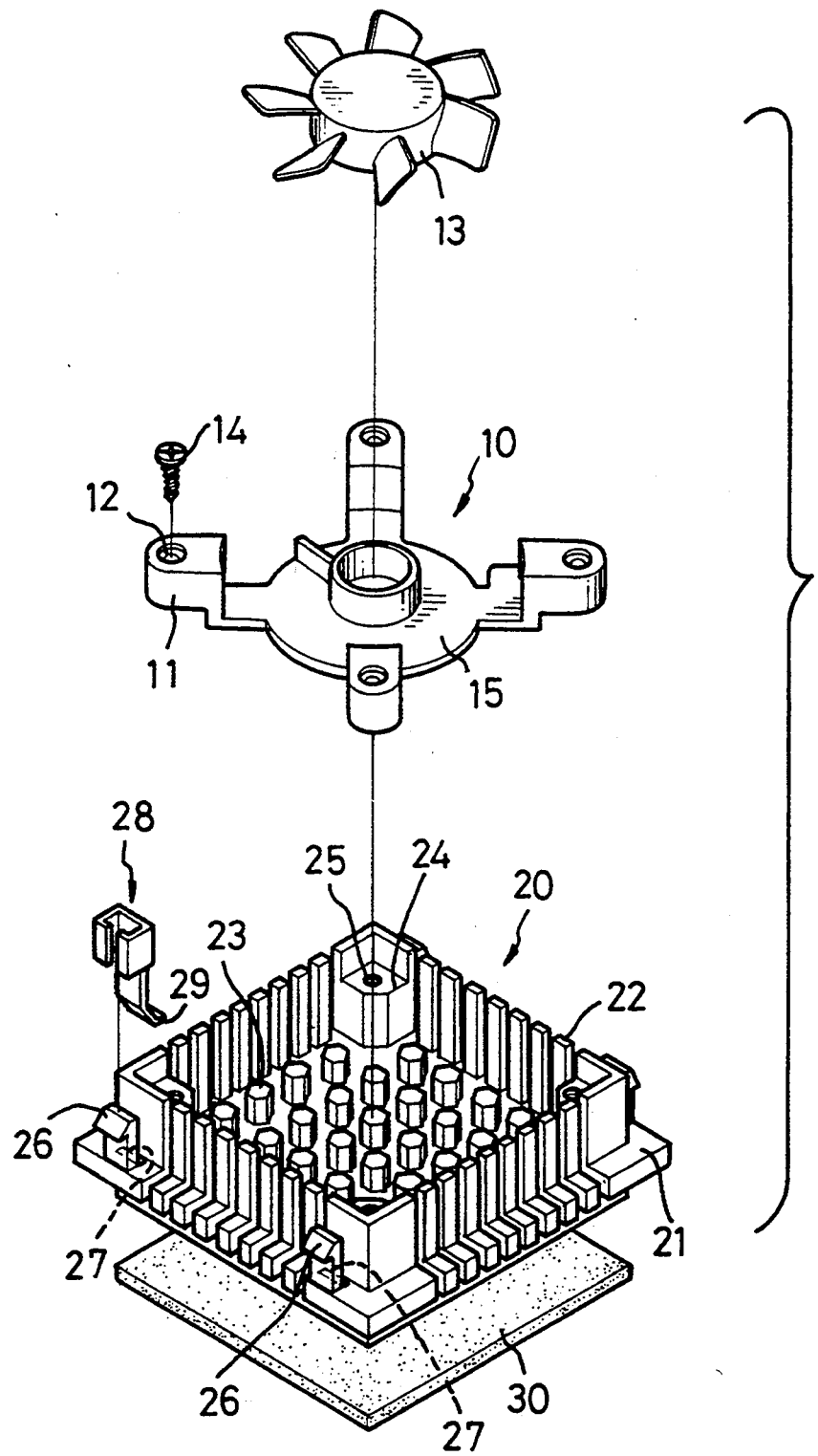
FIG. 2 is an exploded view of the central processing unit and the cooling device therefor.

Referring to FIGS. 1 through 3, a cooling device for a central processing unit or the like in accordance with the present invention generally includes a fin means 20, a fan means 10 mounted in the fin means 20, and a fastening means for securely mounting a central processing unit 30 to the fin means.

The fin means 20 includes a base plate 21 and a plurality of fins 22 projecting upwardly from an upper side of the base plate 21 and extending parallel to a perimeter of the base plate 21 thereby forming a frame-like structure with a second perimeter and defining a space therein. Four ledges (not labeled) are defined between the perimeter of the base plate 21 and the perimeter of the fins 22. A pair of spaced hook members 26 project upwardly from each of two opposed ledges and a slot 27 is formed in the ledge adjacent to each hook member 26.

In the space defined by the first-mentioned fins 22, a plurality of second fins 23 project upwardly from the upper side of the base plate, each second fin 23 having a height less than that of the first fin 22 for mounting the fan means 10 in the space above the second fins 23.

A fastener member 28 has a first end for engaging with an associated hook member 26 and a second flexible hook end 29 passing through the slot 27 to securely retain the central processing unit 30 to an underside of the base plate 21. Preferably, the hook member 26 has a flexible distal hook end and the first end of the fastener member 28 is substantially a U-shaped member for snappingly engaging with the flexible distal hook end of the hook member 26.

The frame-like structure defined by the first fins 22 has four corners, a seat 24 with a hole 25 being provided in each corner for mounting the fan means 10. The fan means 10 includes a fan 13 and a mount plate 15 for mounting the fan 13. The mounting plate 15 has four limbs 11 extending radially and outwardly therefrom, each limb 11 having a second hole 12 therein which aligns with the first-mentioned hole 25 in an associated seat 24, such that the mounting plate 15 together with the fan 13 can be securely mounted within the first fins 22 by bolts or screws 14.

Although the invention has been explained in relation to its preferred embodiment, it is to be understood that many other possible modifications and variations can be made without departing from the spirit and scope of the invention as hereinafter claimed.

I claim:

1. A cooling device for a central processing unit, comprising:
    a fin means including:
        a base plate with an upper side, an underside, and a perimeter; and
        a plurality of fins projecting upwardly from said upper side of said base plate and extending along said perimeter of said base plate thereby forming a second perimeter, four ledges being defined between said first-mentioned perimeter and said second perimeter, at least one hook member being formed on each of two opposed said ledges, a slot being formed in said ledge adjacent to each said hook member;
    a fan means mounted above said fins; and a fastener member having a first end for engaging with said hook member and a second hook end passing through said slot to securely retain a central processing unit to said underside of said base plate.

2. The cooling device as claimed in claim 1 wherein: said fins form a frame-like structure and define a space therein and a plurality of second fins project upwardly from said upper side of said base plate in said space defined by said first-mentioned fins, each said second fin having a height less than that of said first fin for mounting said fan means in said space above said second fins.

3. The cooling device as claimed in claim 2 wherein: said second perimeter defined by said first fins has four corners, a seat with a hole is provided in each said corner for mounting said fan means.

4. The cooling device as claimed in claim 3 wherein: said fan means includes a fan and a mount plate to which said fan is mounted, said mounting plate has four limbs extending radially and outwardly therefrom, each said limb has a second hole therein which aligns with said first-mentioned hole in associated said seat.

5. The cooling device as claimed in claim 1 wherein: said hook member has a flexible distal hook end and said first end of said fastener member is substantially a U-shaped member for snappingly engaging with said flexible distal hook end.

* * * * *